United States Patent
Scherf et al.

(10) Patent No.: US 9,598,614 B2
(45) Date of Patent: Mar. 21, 2017

(54) THREE-DIMENSIONAL ELECTRICALLY CONDUCTIVE ADHESIVE FILM

(71) Applicant: TESA SE, Hamburg (DE)

(72) Inventors: Lesmona Scherf, Hamburg (DE); Thorsten Krawinkel, Hamburg (DE); Alexander Fischer, Hamburg (DE)

(73) Assignee: TESA SE, Norderstedt (DE)

( * ) Notice: Subject to any disclaimer, the term of this patent is extended or adjusted under 35 U.S.C. 154(b) by 0 days.

(21) Appl. No.: 14/397,955

(22) PCT Filed: Apr. 5, 2013

(86) PCT No.: PCT/EP2013/057233
§ 371 (c)(1),
(2) Date: Oct. 30, 2014

(87) PCT Pub. No.: WO2013/164154
PCT Pub. Date: Nov. 7, 2013

(65) Prior Publication Data
US 2015/0129812 A1    May 14, 2015

(30) Foreign Application Priority Data
May 4, 2012   (DE) .................. 10 2012 207 462

(51) Int. Cl.
| | |
|---|---|
| *H01B 1/02* | (2006.01) |
| *H01B 1/22* | (2006.01) |
| *C09J 9/02* | (2006.01) |
| *C09J 7/00* | (2006.01) |
| *C08L 21/00* | (2006.01) |

(52) U.S. Cl.
CPC ................ *C09J 9/02* (2013.01); *C08L 21/00* (2013.01); *C09J 7/00* (2013.01); *H01L 2224/83851* (2013.01)

(58) Field of Classification Search
CPC ............... H01B 1/02; H01B 1/22; H01B 1/24
USPC ................................... 252/512–514
See application file for complete search history.

(56) References Cited

U.S. PATENT DOCUMENTS

| | | | |
|---|---|---|---|
| 3,475,213 | A | 10/1969 | Stow et al. |
| 3,970,608 | A | 7/1976 | Furukawa et al. |
| 4,113,981 | A | 9/1978 | Fujita et al. |
| 4,606,962 | A | 8/1986 | Reylek et al. |
| 5,300,340 | A | 4/1994 | Calhoun et al. |

(Continued)

FOREIGN PATENT DOCUMENTS

| | | |
|---|---|---|
| CN | 1532853 A | 9/2004 |
| DE | 199 12 628 A1 | 1/2000 |

(Continued)

OTHER PUBLICATIONS

International Search Report of PCT/EP2013/057233 mailed Jul. 22, 2013.

(Continued)

*Primary Examiner* — Khanh Tuan Nguyen
(74) *Attorney, Agent, or Firm* — Norris McLaughlin & Marcus, P.A.

(57) ABSTRACT

The invention relates to an adhesive film comprising a layer of an adhesive compound as well as conductive particles that are added to the adhesive compound, characterized in that a portion of the conductive particles are fibrous and a portion of the particles are in the form of dendritic structures.

12 Claims, 1 Drawing Sheet

(56) References Cited

U.S. PATENT DOCUMENTS

| | | |
|---|---|---|
| 6,447,898 B1 | 9/2002 | Pfaff |
| 6,861,138 B1 | 3/2005 | Pfaff et al. |
| 8,840,813 B2 | 9/2014 | Aspin et al. |
| 2010/0276645 A1 | 11/2010 | Aspin et al. |

FOREIGN PATENT DOCUMENTS

| | | | | |
|---|---|---|---|---|
| DE | 198 53 805 A1 | 5/2000 | | |
| EP | 4012061 A1 | * 10/1991 | ............ | C09J 163/00 |
| EP | 2 457 944 A1 | 5/2012 | | |
| WO | 84 01783 A1 | 5/1984 | | |
| WO | 00 01782 A1 | 1/2000 | | |
| WO | 2008 146014 A2 | 12/2008 | | |

OTHER PUBLICATIONS

German Search Report of priority application DE 10 2012 207 426.7 dated Feb. 5, 2013.
English Translation of First Office Action issued in corresponding CN Application 201380023513.8 May 29, 2015.

\* cited by examiner

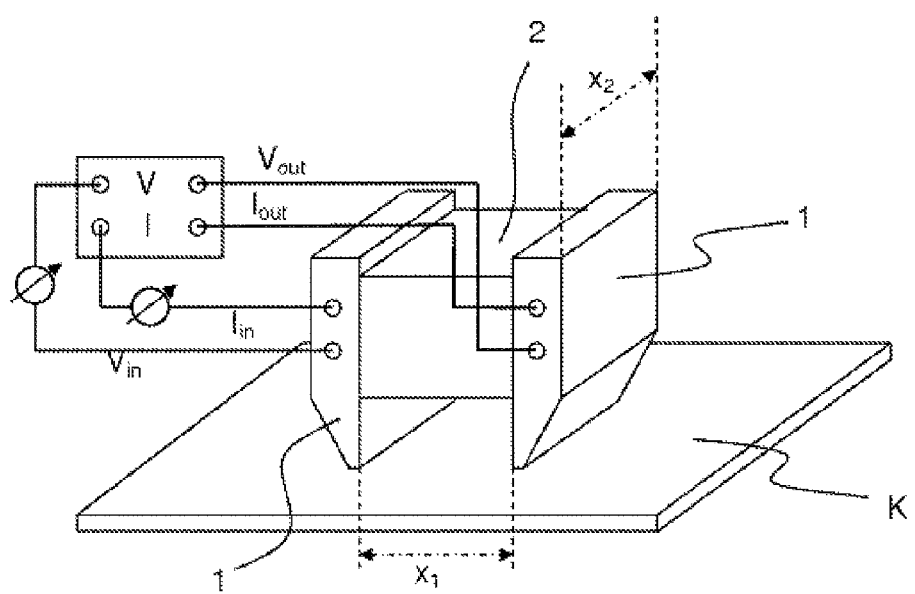

THREE-DIMENSIONAL ELECTRICALLY CONDUCTIVE ADHESIVE FILM

This application is a 371 of International Patent Application No. Ser. PCT/EP2013/057233, filed Apr. 5, 2013, which claims foreign priority benefit under 35 USC §119 of German Application Ser. No. 10 2012 207462.7 filed May 4, 2012, the disclosures of which are incorporated herein by reference.

The invention describes an adhesive film which is electrically conductive in three dimensions and is intended for the permanent adhesive bonding of two articles.

Given that electronic components are becoming ever smaller, with a corresponding increase in their difficulty of processing, the soldering of these parts is frequently no longer possible easily and inexpensively. As a result, an increase has been recorded in the significance of the adhesive bonding of electrical and electronic components by means of electrically conducting layers of adhesive. For this purpose, conductive pigments such as carbon black, metal powders, ionic compounds, and the like are being used in adhesives. There is a range of adhesive tapes on the market that conduct either only in the z-direction, in other words through the adhesive tape, or in both the z- and the x- and y-directions, in other words in the plane of the adhesive tape. There are a series of different possibilities for achieving this conductivity.

One possibility is to use a conductive backing, meaning that the adhesive need only be conducting in the z-direction, although the adhesive tape as a whole is conducting in the x,y-direction as well. The current is conducted through the adhesive to the backing, and is then distributed in the x,y-direction and conducted again in the z-direction through the adhesive to the surface.

It is more difficult to obtain conductivity in the x,y-direction without a backing, in other words with a tape known as an adhesive transfer tape.

In certain sectors, particularly those of the electronics industry, it is necessary to achieve very high bond strengths with thin adhesive tapes. In such scenarios, such as in the bonding of flexible conductor tracks, for example, it is common to use unbacked adhesive tapes as a result, since any backing would make the layer of adhesive too thin for excellent bonding strength. Given that, in these applications, the adhesive tapes are also subject to very high temperatures, such as up to 288° C. in the case of solder contacting of the components, there are also only a small number of backings that could even be used without melting.

Examples of adhesive transfer tapes which conduct only in the z-direction are known from the literature. U.S. Pat. No. 3,475,213, for example, describes statistically distributed spherical particles which consist entirely of a conductive metal or are coated with an electrically conducting metal layer. The particles are somewhat smaller than the layers of adhesive. Described in U.S. Pat. No. 4,113,981 are adhesive tapes which contain electrically conducting, spherical particles possessing a size approximately the same as the thickness of the adhesive tape, these particles being present in the adhesive in a proportion of not more than 30 vol %. Other special embodiments and applications are described in U.S. Pat. No. 4,606,962 or U.S. Pat. No. 5,300,340, for example. When using spherical particles to obtain conductivity in the x- and y-directions as well, moreover, it is necessary to employ a very large amount of particles, since these particles must contact one another.

All of these adhesive tapes described are based on self-adhesive or heat-activatable acrylate adhesives, which are pressure-sensitive adhesives and, as a result, are unable to join two substrates with a strength as required by numerous applications. In particular, bonds which are subject to high tensile, shearing, or torsional loading show signs of detachment after a short time.

The addition of electrically conducting particles in an order of magnitude of up to 30 vol % produces a further lowering in the already generally low bond strength of these pressure-sensitive adhesives. The bonding strengths are not sufficient to ensure permanent bonds for mechanically stressed electronic contacts.

Because the particles protrude from the surface to a certain degree, particularly if high conductivities are required, the particles serve as spacers between the adhesive and the substrate to be bonded, thereby lowering further the bonding performance.

The processes described have the further disadvantage that the bonds can be undone, thereby permitting tampering.

Particularly flexible components such as flexible conductor tracks are subject to high flexural stresses and are particularly susceptible to adhesive failure.

DE 199 12 628 A describes an adhesive tape based on a thermoplastic polymer that is blended with tackifying resins and epoxy resins which provide crosslinking under hot conditions. Conductive particles mentioned are exclusively silver particles or silverized glass beads. This adhesive tape described, however, possesses conductivity only in the z-direction, i.e., perpendicularly to the layer of adhesive.

An adhesive sheet which is conductive in three dimensions is very difficult to achieve using spherical particles, since a very large amount of particles are needed, given that they are required to contact one another, in order to achieve conductivity in the plane. With such a high degree of filling with electrically conductive particles, the bond strength suffers markedly.

Instead of spherical particles, therefore, dendritic particles are often used, possessing a much larger surface area for a given volume and therefore offering the possibility of achieving conductivity for a smaller amount of electrically conductive particles. Especially if produced from solution, however, the surface of the adhesives in this case is very rough, since the individual "armlets" of the dendrites protrude from the adhesive; unlike spherical particles, the dendritic particles are unable all to possess exactly the same size. This significantly restricts the laminatability of the adhesives.

It was an object of the invention, therefore, to get around the disadvantages of the prior art, and to develop an unbacked adhesive tape, electrically conductive in three dimensions, for the permanent adhesive bonding of two adherends, with good laminatability and high bonding strength.

This object is achieved by means of a sheet of adhesive as described in greater detail hereinbelow.

The invention relates accordingly to an adhesive sheet comprising a layer of an adhesive and also conductive particles admixed with the adhesive, with some of the conductive particles being fibriform and some of the particles being in the form of dendritic structures. This sheet is preferably an adhesive transfer sheet, in other words a single-layer, unbacked adhesive sheet, which consists of the layer of the particle-containing adhesive.

BRIEF DESCRIPTION OF THE DRAWING

The invention will now be described in greater detail with reference to the drawing, wherein:

FIG. 1 is a schematic of a measuring setup used to measure electrical resistance in x,y-direction (surface resistance) as described hereinbelow.

Adhesives used are preferably crosslinkable adhesives, more particularly those adhesives which crosslink preferably on exposure to heat.

Preferred in accordance with the invention, therefore, is a heat-activatable, thermally crosslinking sheet of adhesive.

Adhesives

The adhesive sheet of the invention comprises an adhesive matrix incorporating the conductive particles used in accordance with the invention, preferably in homogeneous distribution.

Examples of adhesives which can be used include pressure-sensitive adhesives of inherently known composition. Adhesive sheets that are very advantageous in accordance with the invention, however, possess a matrix composed of a heat-activatedly bondable adhesive. Heat-activatedly bondable adhesives (also referred to in the literature—and in the context of the present specification—as "heat-activatable adhesive" and "thermally activatable adhesive") generally lack self-adhesive properties, or are only weakly self-adhesive, at room temperature, but in some cases may already have a significant inherent tack. The adhesive quality desired for the application, however, is activated only after application, by supply of thermal energy. Cooling then brings about the adhesive bonding, resulting in the required bond strengths.

Heat-activatable (adhesive) sheets or heat-activatable (adhesive) tapes for the purposes of the present specification are double-sided adhesive sheets or adhesive tapes in which the layer of adhesive is realized by a heat-activatedly bondable adhesive. Even before being applied to the substrate to be bonded, heat-activatable sheets and tapes are of two-dimensional design, and can in principle be single-layer (known as adhesive transfer tapes) or multilayer systems, the latter with or without backing or carrier layer(s). The conductive adhesive sheets of the invention are single-layer and unbacked.

For use, the heat-activatable sheets or tapes are applied to the substrate to be bonded, or introduced between the substrates to be bonded, at room temperature or at elevated temperatures, for example. Application is followed by activation in order to bring about the ultimate adhesive bonding.

Heat-activatable adhesives of the kind also suitable as a matrix for the adhesive sheet of the invention can be differentiated fundamentally into two categories—that is, into thermoplastic heat-activatable adhesives and into reactive heat-activatable adhesives.

a) Thermoplastic Heat-Activatable Adhesives

These adhesives lack self-adhesive properties, or are weakly self-adhesive, at room temperature. The adhesive becomes activated only by heat, and becomes self-adhesive at the same time. Responsibility for this is possessed by a correspondingly high glass transition temperature on the part of the adhesive, meaning that the activation temperature for achieving a sufficient tack—generally from a few tens to a hundred degrees Celsius—is above room temperature. An adhesive effect comes about even before the composition has set, owing to the self-adhesive properties. After the joining of the bond partners, in the course of cooling, the thermoplastic, heat-activatable adhesive sets, with solidification, physically (on use of suitable thermoplastic materials as adhesive composition, resulting generally in reversible bonding), possibly chemically as well (when using suitable thermoplastically reactive materials as adhesive composition, resulting generally in irreversible bonding), so that the bonding effect is retained in the cooled state where it has developed the actual bond strengths.

The greater the quantity of heat, pressure and/or time employed for adhesive bonding, the stronger, in general, is the joining of the two materials to be bonded. By this means it is regularly possible to realize maximum assembly strengths under technically easy processing conditions.

Thermoplastics are compounds of the kind defined in Römpp (Online Version; 2008 edition, document code RD-20-01271).

b) Reactive Heat-Activatable Adhesives

This rubric covers polymer systems of the kind having functional groups such that on supply of heat, a chemical reaction occurs, with the adhesive undergoing chemical setting and thus bringing forth the adhesive effect. Reactive heat-activatable adhesives generally do not become self-adhesive on supply of heat, and so the adhesive effect ensues only after setting has taken place. In many cases, reactive heat-activatable adhesives are not thermoplastic, but are instead realized by means of an elastomer/reactive resin system (compare, however, the heat-activatable films by means of thermoplastic-reactive materials; see above).

The glass transition temperature is not significant for the functionality of reactive systems. Adhesives are constructed in principle from one or more polymers (of the base polymer component, referred to for simplicity as base polymer), with further components generally being admixed for the purpose of fine-tuning the properties (such as, for example, resins (tackifying resins and/or reactive resins), plasticizers, and the like) and with the optional possibility of further additives, favorably influencing the properties of the adhesive (such as fillers, for example, or the conductive particles that are relevant in the present invention), being admixed.

Suitable elastomers which can be used as a base polymer for the adhesives of the invention—particularly for reactive heat-activatable adhesives—may be selected preferably from the group encompassing polyolefins—such as, for example, poly-alpha-olefins, polyisobutylene, polyisoprene, polybutadiene, or amorphous polypropylene-, nitrile rubbers, polychloroprenes, polyethylene-vinyl acetates, polyethylene-vinyl alcohols, styrene-butadiene rubbers, polyesters, polyurethanes and/or polyamides. Particularly preferred is the use of nitrile rubbers.

Particularly suitable from the group of the polyurethanes are the thermoplastic polyurethanes (TPU), which are known as reaction products of polyesterols or polyetherols and organic diisocyanates. These materials may be used as thermoplastic and also as thermoplastic-reactive heat-activatable systems.

The stated polymers may each be used alone and in a mixture (with one or more further polymers).

For thermoplastic-reactive heat-activatable adhesive sheets and for reactive heat-activatable adhesive sheets (i.e., those based on elastomer), in particular, the base polymer is admixed with one or more reactive resins. The fraction of the resins as a proportion of the heat-activatable adhesive is preferably between 30 and 75 wt %, based on the mass of the mixture of base polymer and reactive resin (without conductive particle additions).

As reactive resin, it is possible with preference in accordance with the invention to select one or more resins, independently of one another, from the following group, encompassing the resins listed with a dash:

epoxy resins; advantageously those having an average molecular weight $M_w$ (weight average) of 100 g/mol up to a maximum of 10 000 g/mol. Reactive resins in the upper molecular weight range that can be used include, for example, polymeric epoxy resins.

Epoxy resins which can be used advantageously include, for example, the reaction product of bisphenol A and epichlorohydrin, epichlorohydrin, glycidyl ester, the reaction product of epichlorohydrin and p-aminophenol.

Preferred commercial examples are, e.g., Araldite™ 6010, CY-281™, ECN™ 1273, ECN™ 1280, MY 720, RD-2 from Ciba Geigy, DER™ 331, DER™ 732, DER™ 736, DEN™ 432, DEN™ 438, DEN™ 485 from Dow Chemical, Epon™ 812, 825, 826, 828, 830, 834, 836, 871, 872, 1001, 1004, 1031, etc., from Shell Chemical, and HPT™ 1071, HPT™ 1079, likewise from Shell Chemical.

Examples of commercial aliphatic epoxy resins are, e.g., vinylcyclohexane dioxides, such as ERL-4206, ERL-4221, ERL 4201, ERL-4289 or ERL-0400 from Union Carbide Corp.

Novolak resins. From this group, the following may be used, for example: Epi-Rez™ 5132 from Celanese, ESCN-001 from Sumitomo Chemical, CY-281 from Ciba Geigy, DEN™ 431, DEN™ 438, Quatrex 5010 from Dow Chemical, RE 305S from Nippon Kayaku, Epiclon™ N673 from DaiNippon Ink Chemistry, or Epicote™ 152 from Shell Chemical.

To use melamine resins, such as Cymel™ 327 and 323 from Cytec, for example.

To use terpene-phenolic resins, such as NIREZ™ 2019 from Arizona Chemical, for example Phenolic resins, such as YP 50 from Toto Kasei, PKHC from Union Carbide Corp., and BKR 2620 from Showa Union Gosei Corp., for example.

Phenolic resole resins, in particular in combination with other phenolic resins too.

Polyisocyanates, such as Coronate™ L from Nippon Polyurethane Ind., Desmodur™ N3300, or Mondur™ 489 from Bayer, for example.

In order to optimize the technical adhesive properties and the activation range, the adhesive may optionally be admixed with bond strength-boosting resins (known as tackifier resins or tackifiers). Suitable resins include hydrogenated and unhydrogenated derivatives of rosin, polyterpene resins, preferably based on alpha-pinene, terpenephenolic resins, noncrosslinking phenolic resins, novolaks, hydrogenated and unhydrogenated polymers of dicyclopentadiene, hydrogenated and unhydrogenated polymers of preferably C-8 and C-9 aromatics, hydrogenated C-5/C9 polymers, aromatics-modified, selectively hydrogenated dicyclopentadiene derivatives, resins based on pure aromatics, such as alpha-methylstyrene, vinyltoluene, or styrene, for example, and resins comprising mixtures of different aromatic monomers, and coumarone-indene resins, which are obtained from coal tar.

Aforementioned tackifier resins may be used both alone and in a mixture of two or more tackifier resins.

These tackifier resins are preferably selected such that the sheets of adhesive at room temperature have only very little pressure-sensitive tack, or none, and acquire their tack only under hot conditions. Heat-activatable sheets of this kind are best obtained through the selection of high-melting resins, especially those having a softening point of well above 110° C. (figures given for the softening point of resins are given by analogy to DIN EN 1427:2007 with the respective resin instead of bitumen; in the case of softening temperatures above 150° C., procedure 8.1 b from that specification is employed by analogy). Lower-melting resins may also be employed, but are used advantageously only in a small amount, preferably below 30 wt %, based on the overall adhesive without electrically conducting particles.

Crosslinkable adhesives are used advantageously for the adhesive sheet of the invention, more preferably those which crosslink on exposure to heat.

For the purpose of crosslinking it is possible to add crosslinkers (also referred to as curing agents), more particularly chemical crosslinkers, to the adhesive, especially those which are able to react with at least one of the reactive resins. Crosslinkers are not necessary for the reaction, but may be added particularly in order to scavenge an excess of reactive resin. When using epoxy resins as reactive resin, in particular, crosslinkers have emerged as being advantageous.

Crosslinkers or curing agents employed are primarily the following compounds, as described in more detail in U.S. Pat. No. 3,970,608 A, for example:

polyfunctional aliphatic amines such as, for example, triethylenetetramine polyfunctional aromatic amines such as, for example, isophoronediamine guanidines such as, for example, dicyandiamide polyfunctional phenols polyfunctional alcohols polyfunctional mercaptans polyfunctional carboxylic acids acid anhydrides having one or more anhydride groups In order to raise the reaction rate in the crosslinking reaction it is possible to use what are called accelerators.

Accelerators may be, for example, the following:

tertiary amines such as benzyldimethylamine, dimethylaminomethylphenol, tris(dimethylaminomethyl)phenol boron trihalide/amine complexes substituted imidazoles triphenylphosphine.

When using phenolic resins (especially alkylphenolic resins), formaldehyde donors may be added, such as hexamethylenetetramine.

An optional possibility for adjusting the desired properties of the adhesive, more particularly of the heat-activatable adhesive, is to add fillers (e.g., (in particular nonconducting) fibers, carbon black, zinc oxide, titanium dioxide, chalk, solid or hollow glass spheres, microspheres made from other materials, silica, silicates), nucleators, expandants, bonding booster additives, and thermoplastics, compounding agents and/or aging inhibitors, in the form, for example, of primary and secondary antioxidants or in the form of light stabilizers.

Further additives which may typically be utilized are as follows: primary antioxidants, such as sterically hindered phenols, secondary antioxidants, such as phosphites or thioethers, in-process stabilizers, such as C-radical scavengers, light stabilizers, such as UV absorbers or sterically hindered amines, antiozonants, metal deactivators, and processing assistants, for example, to name but a few.

It has emerged that through the use of a mixture of dendritic metal particles and conductive fibriform particles, distinct advantages are obtained in contrast to the use of only one of these two particle forms.

In the case of the pure use of dendritic particles, the surface of the adhesive tape is very rough, with a large proportion of the particles protruding from the adhesive and preventing effective flow.

Fibriform particles adopt an orientation when the adhesive tape is produced from solution, and are oriented preferably in the web direction. The conductivity in that direction, therefore, is very much higher than at right angles thereto. Moreover, the conductivity in the z-direction is much less than when using dendritic particles.

Surprisingly it has now been found that for a mixture of these particles, the performance which can be achieved is much better than when using only one of the particle varieties (fibriform or dendritic), even if the total amount of conductive particles is not increased. On the one hand, the conductivity in the z-direction is still extremely good, and does not change, compared with the use of purely dendritic particles. The conductivity in the x,y-direction is still as good as for the use of pure fibers, and the difference between the web direction and the direction at right angles thereto is still only very small. As a result of the reduced fraction of dendrites, however, the adhesive now has much better laminatability and much greater bond strength.

The overall content of particles can in fact be lowered somewhat, without any significant reduction in the x-direction conductivity.

One variety of the conductive particles admixed to the adhesive sheet of the invention are particles whose structure exhibits an anisotropic, multiply branched morphology in which smaller side branches (secondary arms) come out from a trunk (primary arm), and may in turn have side branches (tertiary arms). The branches here may be straight or curved and may in each case be branched in turn, similarly to the structure of a fir tree. Particles of these kinds are referred to in the literature—and for the purposes of the present specification as well—as "dendrites", as "dendritic particles", as "particles with dendritic form", and as "particles with dendritic structure". The extent in one dimension is commonly greater than in at least one other dimension, more particularly than in both other dimensions.

Dendritic particles used in accordance with the invention are particles which have at least secondary arms, preferably those which possess at least tertiary arms as well.

Employed as dendritic particles may with preference be dendritic metal particles, made of zinc, iron, bismuth, copper, silver, or gold, for example, to name but a few. Depending on ambient conditions, the metal of the particles is selected such that the particles do not fail as a result of oxidation after a short time. Preference is given to using copper or silver dendrites. Gold may likewise be used outstandingly, but it is very expensive. In order to utilize the high conductivity and good oxidation stability of silver without having costs that are too high, it is preferred for silverized copper dendrites to be used, with the copper being preferably covered fully by the layer of silver. Depending on the size of the particles, different amounts of silver are used in order to cover the copper completely. In the case of particles between 30 and 40 µm, this figure is about 20% silver.

The average size of the dendrites is preferably selected such that their maximum extent corresponds approximately to the thickness of the adhesive sheet. Very preferable, therefore, are dendritic particles having an average maximum extent in the range from 20 to 100 µm, preferably in the range from 40 to 80 µm.

The second variety of conductive particles added to the adhesive sheet of the invention have a fibriform structure. Fibriform particles have an extent in one preferential direction that is significantly greater than in any extent perpendicular to the preferential direction. Employed very preferably as fibers are particles whose maximum extent is at least three times as large as the greatest extent perpendicularly to the direction of maximum extent. The size of the fibers ought to be selected to be small, and the length of the fibers (maximum extent of the fiber particles) ought not to be greater than ten times the thickness of the layer of adhesive. Preference is given to using particles having a length no greater than 5 times the thickness of the layer of adhesive, more preferably those with no more than twice the length, based on the thickness of the layer of adhesive, very preferably 1.5 times the length of the thickness of the layer of adhesive. The shorter the fibers, the more practical the coatability of the solution of adhesive.

The fibriform particles may either consist directly of metal, or else preferably metallized fibers, more particularly metallized glass fibers, are used. Metallized carbon fibers are also suitable. The metal layer in this case preferably covers at least the predominant part of the surface of the inner material, very preferably the entire surface of the inner material.

Utilized ideally are fibriform particles which on their outside (in other words on at least the predominant part of their surface) contain the same metal as the dendrites do on at least the predominant part of their surface, so that no electrical local element is produced, with the possibility that a metal might be broken down.

Preference is given to using silverized copper dendrites in a mixture of silverized glass fibers.

The ratio of dendrites to fibers may fluctuate, but neither of the two species of particle should be present in more than a tenfold excess, based on the total weight of the conductive particles. Fibers and dendrites are used very advantageously in equal weight proportions.

The fraction of the conductive particles (dendrites and fibers together) is between 40 and 90 wt %, based on the total mass of the adhesive including particles; the amount is preferably between 50 and 80 wt %, more preferably between 55 and 70 wt %.

The adhesive sheet of the invention may be used outstandingly for adhesive bonds in the electronics sector, as for example for the bonding of electronic conductor tracks.

The adhesive sheets of the invention very preferably have thicknesses in the range from 30 to 100 µm, preferably from 40 to 50 µm.

Experimental Section:

Bonding of FCCLs with the Adhesive Tape Produced

A Pyralux LF9110R (1 oz Cu/)+(25 µm adhesive)+(25 µm Kapton) FCCL (Flexible Copper Clad Laminate) is bonded to a steel stiffener, in each case using the adhesive tapes produced according to the examples. For this operation, the adhesive tape in a width of 1.5 cm is laminated at 100° C. onto the polyimide film of the polyimide film/copper foil FCCL laminate, with the adhesive strip being somewhat shorter than the FCCL to be bonded, in order later to have a grip tab. This assembly of FCCL and adhesive tape is then laminated onto a steel stiffener at 100° C., and the entire assembly is compressed in a heatable Bürkle press at 180° C. under a pressure of 1.3 MPa for 20 minutes.

L-Peel Test with FCCL/Stiffener Assembly [IPC-TM-650 No. 2.4.9]

Using a tensile testing machine from Zwick, the FCCL of the assemblies of FCCL and steel produced by the method described above is peeled from the stiffener at a 90° angle at a rate of 50 mm/min, and the force required in N/cm is recorded.

Electrical Resistance

The measurements are made in accordance with military standard MIL-DTL-83528C.

Electrical Resistance in z-Direction

A sample of the adhesive sheet is freed from any release sheets or release papers that may be present, and a section measuring 5×5 cm$^2$ is cut out. This section is then placed between two cylindrical, gold-plated electrodes, cleaned beforehand with ethanol and each having a circular contact area of 1 inch$^2$ (in each case one end face of the respective cylindrical electrode), which are connected to a current/voltage source and to a sensitive ohmmeter. The adhesive sheet is then aligned horizontally between each of the likewise horizontal contact areas. The lower of the electrodes lies, by its end face remote from the adhesive sheet, on a solid surface. A 5 kg weight is then placed onto the end face of the upper electrode, remote from the adhesive sheet, in order to optimize the contacting of the adhesive sheet. Measurement takes place at 23° C. and 50% rh. The resistance is measured in ohms.

Electrical Resistance in x,y-Direction (Surface Resistance)

A sample of the noncrosslinked adhesive sheet is freed from any release films or release papers that may be present, and a section measuring 5×5 cm$^2$ is cut out. A measuring setup is used as depicted in FIG. 1. The reference symbols have the following meanings:

V voltage source
I current source
K adhesive sheet sample
1 gold-plated electrodes
2 insulator
$x_1$, $x_2$ length and width of the electrode interface, 1 inch in each case After being cleaned with ethanol, the electrode is placed onto the sample. The area between the two parts of the electrode is precisely 1 inch$^2$, 6.45 mm$^2$. Again, measurement takes place at 23° C. and 50% rh. The weight of the electrode system (electrodes and insulator) is 240 g.

The value measured is reported in ohms.

In order to distinguish a preferential direction, the sample is measured once in the x-direction, this being the direction in which coating was carried out, and once in the y-direction, transverse to the direction of coating.

EXAMPLES

Example 1

A suspension of 66.5 wt % Breon N41H80 (nitrile rubber from Zeon with 41% acrylonitrile), 33 wt % Epiclon 660 (Novolak resin from DIC), and 0.5 wt % 2-phenyl-imidazole (based on solids; used at 30% strength in butanone) was prepared in a kneading apparatus. The kneading time was 20 hours.

Added subsequently to the suspension per 30 parts (based in each case on the weight) of solid constituents of the adhesive were 35 parts of dendritic silverized copper particles from Potters (SC25D20S) and 35 parts of silverized glass fibers having a maximum length of 40 μm, from Nanotechnologies (STAR SHIELD AG 5512 FI).

The heat-activatable composition was subsequently coated out onto a siliconized PET film and dried at 100° C., to give a layer of adhesive 40 μm thick.

Comparative Example 2

Instead of the mixture of fibers and dendrites, 70 parts of dendrites were added.

Comparative Example 3

Instead of the mixture of fibers and dendrites, 70 parts of fibers were added.

Results:

|  | L-peel test in N/cm | Conductivity in z-direction in ohms | Conductivity in x-direction in ohms | Conductivity in y-direction in ohms |
|---|---|---|---|---|
| Example 1 | 8.2 | 0.0005 | 0.14 | 0.21 |
| Comparative example 2 | 5.7 | 0.0004 | 0.16 | 0.17 |
| Comparative example 3 | 8.5 | 2.4 | 0.09 | 0.52 |

A striking feature for comparative example 2 is its very poor laminatability onto the FCCL. This lamination is very much easier for example 1. Despite this, the conductivity is of similar quality, in contrast to example 3.

Example 4

A suspension of 66.5 wt % Breon N41H80 (nitrile rubber from Zeon with 41% acrylonitrile), 33 wt % Epiclon 660 (Novolak resin from DIC), and 0.5 wt % 2-phenyl-imidazole (based on solids; used at 30% strength in butanone) was prepared in a kneading apparatus. The kneading time was 20 hours.

Added subsequently to the suspension per 40 parts of solid constituents of the adhesive were 30 parts of dendritic silverized copper particles from Potters (SC25D20S) and 30 parts of silverized glass fibers having a maximum length of 40 μm, from Nanotechnologies (STAR SHIELD AG 5512 FI).

The heat-activatable composition was subsequently coated out onto a siliconized PET film and dried at 100° C., to give a layer of adhesive 40 μm thick.

Comparative Example 5

Instead of the mixture of fibers and dendrites, 60 parts of dendrites were added.

Comparative Example 6

Instead of the mixture of fibers and dendrites, 60 parts of fibers were added.

Results:

|  | L-peel test in N/cm | Conductivity in z-direction in ohms | Conductivity in x-direction in ohms | Conductivity in y-direction in ohms |
|---|---|---|---|---|
| Example 4 | 10.4 | 0.0006 | 0.30 | 0.43 |
| Comparative example 5 | 8.3 | 0.0006 | >10 | >10 |
| Comparative example 6 | 10.8 | >10 | 0.23 | 1.44 |

Particularly when relatively small fractions of particles are used, it can be seen that a mixture of dendrites and fibers is very advantageous, since only with a combination is it still possible to achieve high conductivities and low electrical resistances in all three directions.

The invention claimed is:
1. An adhesive sheet comprising a layer of an adhesive and also conductive particles admixed to the adhesive, wherein some of the conductive particles are fibriform and some of the particles are in the form of dendritic structures wherein the adhesive sheet exhibits conductivity in x-, y- and z-directions.

2. The adhesive sheet as claimed in claim 1, wherein the adhesive is a heat-activatedly bondable adhesive.

3. The adhesive sheet as claimed in claim 1, wherein the fibriform conductive particles are metal fibers and/or metallized fibers.

4. The adhesive sheet as claimed in claim 1, wherein the dendritic conductive particles are metal particles and/or metallized particles.

5. The adhesive sheet as claimed in claim 1, wherein the fibriform conductive particles and the surface of the dendritic conductive particles have surfaces composed of the same material.

6. The adhesive sheet as claimed in claim 1, wherein the dendritic conductive particles are silverized copper particles, and the fibriform conductive particles are silverized glass fibers.

7. The adhesive sheet as claimed in claim 1, wherein the fibriform conductive particles have a maximum length that is not greater than ten times the thickness of the adhesive sheet.

8. The adhesive sheet as claimed in claim 1, wherein a total fraction of the conductive particles in the adhesive sheet is 40 to 90 wt %.

9. The adhesive sheet as claimed in claim 1, wherein a weight ratio V of the fibriform conductive particles to the dendritic conductive particles is in the range from 10:1 to 1:10.

10. A method of bonding two articles together, said method comprising bonding the two articles via an adhesive sheet as claimed in claim 1.

11. The method as claimed in claim 10, wherein one of the articles comprises electronic conductor tracks.

12. An unbacked adhesive sheet comprising a layer of adhesive and also conductive particles admixed to the adhesive, wherein some of the conductive particles are fibriform and some of the particles are in the form of dendritic structures, and wherein the unbacked adhesive sheet exhibits conductivity in x-, y- and z-directions.

* * * * *